United States Patent
Smyth et al.

(10) Patent No.: US 9,059,727 B2
(45) Date of Patent: Jun. 16, 2015

(54) HYBRID CODED AUDIO DATA STREAMING APPARATUS AND METHOD

(75) Inventors: Neil Smyth, Bangor Co Down (GB); David Trainor, Belfast (GB)

(73) Assignee: Cambridge Silicon Radio Limited, Cambridge (GB)

( * ) Notice: Subject to any disclaimer, the term of this patent is extended or adjusted under 35 U.S.C. 154(b) by 443 days.

(21) Appl. No.: 13/463,003

(22) Filed: May 3, 2012

(65) Prior Publication Data

US 2012/0290306 A1 Nov. 15, 2012

(30) Foreign Application Priority Data

May 12, 2011 (GB) .................................. 1107947.2

(51) Int. Cl.
*G10L 19/00* (2013.01)
*H03M 7/30* (2006.01)
*G10L 19/032* (2013.01)
*G10L 19/002* (2013.01)

(52) U.S. Cl.
CPC ........... *H03M 7/3082* (2013.01); *G10L 19/032* (2013.01); *G10L 19/002* (2013.01); *H03M 7/3053* (2013.01)

(58) Field of Classification Search
CPC ... G10L 19/00; G10L 19/0017; G10L 19/002; G10L 19/008; G10L 19/020204; G10L 19/032; G10L 19/173; G10L 19/22; G10L 19/24; G10L 2019/00
USPC .................................. 704/500, 501, 503, 504
See application file for complete search history.

(56) References Cited

U.S. PATENT DOCUMENTS

| | | | |
|---|---|---|---|
| 6,081,783 A * | 6/2000 | Divine et al. | .................. 704/500 |
| 6,487,535 B1 * | 11/2002 | Smyth et al. | .................. 704/500 |
| 2009/0073006 A1 | 3/2009 | Wegener | |
| 2009/0306993 A1 | 12/2009 | Wuebbolt et al. | |
| 2010/0027625 A1 * | 2/2010 | Wik et al. | ................ 375/240.12 |

FOREIGN PATENT DOCUMENTS

| | | |
|---|---|---|
| EP | 0910063 | 4/1999 |
| WO | WO 97/21211 | 6/1997 |
| WO | WO 2004/097797 | 11/2004 |

OTHER PUBLICATIONS

Great Britain Search Report for GB Application No. 1107947.2, dated Aug. 17, 2012.

* cited by examiner

Primary Examiner — Qi Han
(74) Attorney, Agent, or Firm — RatnerPrestia (57) ABSTRACT

An audio coding system in which a plurality of quantization methods are selectable for application to components of a streamed audio signal to achieve a target frame size that is determined by comparing an achieved bit rate against a target bit rate. Based on the target frame size, the system calculates a bit allocation for signal components and compares the bit allocation to the dynamic range of the signal components. Depending on the outcome of the comparison, the system may select to quantize or not quantize a signal component. The system employs lossless coding techniques, but is capable of introducing lossy coding by quantization in order to meet the target bit rate.

23 Claims, 6 Drawing Sheets

$$q_n = \begin{cases} D\left(\dfrac{\frac{2x_n+1}{2^b}-1}{\frac{x_n}{2^s}}-1\right), & \text{if } s \leq -T_c \\ \dfrac{x_n}{2^s}, & \text{if } -T_c < s < 0 \text{ and } D > A - T_{thresh} \\ x_n, & \text{if } s \geq 0 \end{cases} \quad [1]$$

$$D = \max_{0 \leq n < N-1} \left(2^{\log_2 |x_n|} + 1\right) \quad [2]$$

$$s = B - D \quad [3]$$

FIG. 6

HYBRID CODED AUDIO DATA STREAMING APPARATUS AND METHOD

FIELD OF THE INVENTION

The present invention relates to coded data streaming, especially coded audio data streaming.

BACKGROUND TO THE INVENTION

Lossless audio coding algorithms are typically precluded from real-time streaming applications due to their undeterminable and often excessive bit rate. This restriction is often most stringent in wireless communications, where power consumption and complexity are restricted.

As the bandwidth and latency of wired and wireless communications technologies continues to improve there exists new applications for audio streaming in, for example, consumer electronics such as modular home audio networking systems, portable media players (PMPs) and wireless speakers.

It would be desirable to utilize this increasing data bandwidth to perform real-time wireless streaming of audio data coded in a lossless or near-lossless format. In particular, it would be desirable to be able to stream audio data at lossless, or at least perceptually-lossless, quality over a transmission channel having bandwidth that is insufficient to support direct transmission of uncoded audio data.

SUMMARY OF THE INVENTION

A first aspect of the invention provides an audio encoder as claimed in claim 1.

Preferably, the quantizer is arranged not to quantize said signal components if said comparison of said respective dynamic range with said respective component bit allocation indicates that said respective dynamic range can be losslessly accommodated by said respective component bit allocation. Typically, said quantizer is arranged to quantize said signal components if said comparison of said respective dynamic range with said respective component bit allocation indicates that said respective dynamic range cannot be losslessly accommodated by said respective component bit allocation.

In preferred embodiments, the quantizer is configured to support a plurality of selectable different quantization methods, the encoder being arranged to select one or other of said quantization methods for application to said received signal components depending on said comparison of said respective dynamic range with said respective component bit allocation. Each quantization method is configured to apply a respective different level of quantization. Advantageously, one of said quantization methods is configured to apply no quantization. Hence signals can pass losslessly through the quantizer if appropriate.

The encoder may be arranged to select one or other of said quantization methods for application to said received signal components depending on the extent by which the number of bits required to accommodate the respective dynamic range exceeds the respective component bit allocation.

In order to calculate said respective component bit allocation for each signal component, said encoder may be arranged to assign a respective lossless bit allocation to each signal component, said lossless bit allocation corresponding to the respective dynamic range of the signal component, to compare the total of the lossless bit allocations with a total bit allocation for the respective slice and, if the total of the lossless bit allocations exceeds the total bit allocation for the respective slice, to reduce one or more of the respective lossless bit allocations until the total of the initial bit allocations does not exceed the total bit allocation for the respective slice.

Preferably, said encoder is arranged to reduce the bit allocation of one or more signal components in an order corresponding to a weighting of said signal components, wherein said weighting is preferably determined by the relative perceptual significance of said signal components to a human listener. If the total of the lossless bit allocations does not exceed the total bit allocation for the respective slice, the encoder may use said lossless bit allocations as said component bit allocations.

In typical embodiments, the encoder includes a pre-quantization coder arranged to apply one or more data compression methods, preferably lossless data compression methods, to said un-encoded audio data samples. The pre-quantization coder may apply a spectral decomposition transform, preferably a lossless transform, to said un-encoded audio data samples to produce a plurality of spectral audio data components.

Usually, the input signal comprises a plurality of audio channels, said encoder being arranged to perform said spectral decomposition in respect of each channel, each signal component comprising a respective spectral audio data component of a respective channel. The pre-quantization coder may perform inter-channel or intra-channel decorrelation of said channels.

Typically, the encoder includes a post-quantization coder arranged to apply one or more data compression methods, preferably lossless data compression methods, to the quantized audio data samples. The post-quantization coder arranged to perform inter-channel or intra-channel decorrelation of said channels.

A second aspect of the invention provides an audio data compression system comprising the encoder of the first aspect of the invention and a corresponding decoder arranged for communication with one another across a communications link.

A third aspect of the invention provides a method of encoding an audio input signal as claimed in claim 22.

A fourth aspect of the invention provides a computer program product as claimed in claim 23.

Preferred embodiments of the invention employ lossless coding techniques where possible, or appropriate, but are configured to selectively switch to lossy coding techniques when a bandwidth threshold, e.g. the average transmission channel bandwidth, is reached or it is determined that the bandwidth threshold will be exceeded. Such an approach may be termed "hybrid" lossless/lossy coding.

Preferably, apparatus and methods embodying the invention are arranged to allow, or cause, real-time changes to the average coded bit rate. This enables optimal performance for a range of possible usage scenarios to be achieved.

Preferred embodiments of the invention comprise a quantization apparatus, or support a quantization method, that enables hybrid lossless and/or lossy coding, and advantageously support transmission of streaming audio data over a bandwidth-restricted communications channel.

In typical embodiments, a plurality of quantization methods are selectable for application to components of a streamed audio signal to achieve a target frame size that is determined by comparing an achieved bit rate against a target bit rate. Based on the target frame size, the system calculates a bit allocation for signal components and compares the bit allocation to the dynamic range of the signal components.

Depending on the outcome of the comparison, the system may select to quantize or not quantize a signal component.

The system employs lossless coding techniques, but is capable of introducing lossy coding by quantization in order to meet the target bit rate.

Further advantageous aspects of the invention will be apparent to those ordinarily skilled in the art upon review of the following description of a specific embodiment and with reference to the accompanying drawings.

BRIEF DESCRIPTION OF THE DRAWINGS

An embodiment of the invention is now described by way of example and with reference to the accompanying drawings in which.

DETAILED DESCRIPTION OF THE DRAWINGS

Figure 1:
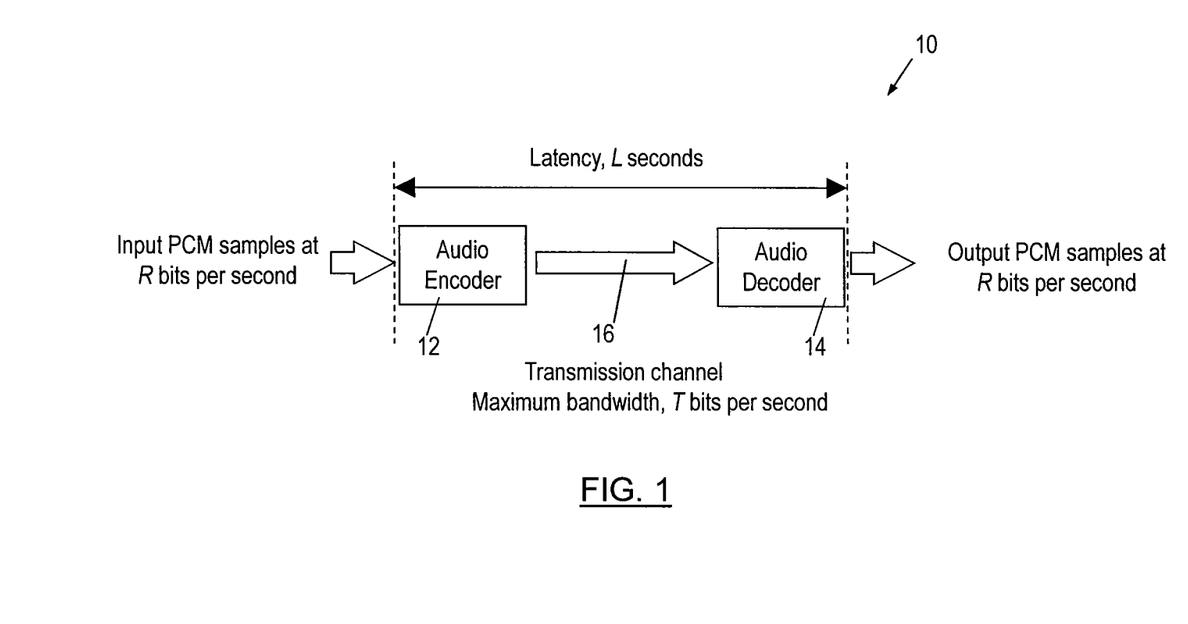
FIG. 1 is a block diagram of a streaming audio transmission system using an audio coding algorithm.

Referring now to FIG. 1 of the drawings there is shown, generally indicated as 10, an audio transmission system comprising an audio encoder 12 and an audio decoder 14 (which may collectively be referred to as a codec) capable of communicating with each other via a communications link 16. The communications link 16 may be wired, but in the present example is assumed to comprise a wireless link. Hence, the encoder 12 comprises, or is co-operable with, a wireless transmitter or transceiver (not shown) and the decoder 14 comprises, or is co-operable with, a wireless receiver or transceiver (not shown). The communications link 16 supports a data transmission channel between the encoder 12 and decoder 14 with a maximum bandwidth, which in this example is denoted as T and may be measured in bits per second.

In use, the encoder 12 receives an input signal comprising audio data samples. The data samples are received at a rate denoted as R in this example, which may be measured in bits per second. The data samples typically comprise pulse code modulated (PCM) data samples, but may alternatively comprise any other suitable digital, or digitized, data samples. The decoder 14 produces an output signal comprising audio data samples. The data samples are assumed to be output at the same rate R and are assumed to comprise pulse code modulated (PCM) data samples, but may alternatively comprise any other suitable digital, or digitized, data samples.

Hence, the digital audio stream has an uncoded bit rate of R bits per second and needs to be coded by the encoder 12 and sent over the transmission channel 16, which is capable of transmitting a maximum bit rate of T bits per second, where T<R.

The system 10 may be said to be a streaming transmission system since the data is streamed in real time from the encoder 12 to the decoder 14. The delay between data being received by the encoder 12 and being output by the decoder 14 is the latency of the system 10. In this example, latency is denoted by L, and may be measured in seconds.

Ideally, the encoder 12 is configured to apply one or more lossless compression methods to the unencoded incoming data to produce coded data for transmission across the link 16. The compression reduces the bit rate of the data stream compared to the uncoded rate R, the aim being to reduce the bit rate such that it does not exceed T. In alternative embodiments, the encoder 12 may be configured to apply one or more lossy compression methods to the unencoded incoming data (e.g. instead of lossless techniques). However, such embodiments suffer less from the problems outlined below and so are less compatible with the aims of the invention.

Any suitable lossless compression method(s) may be employed, for example spectral decomposition (commonly referred to as sub-band coding (SBC)) and/or inter-channel decorrelation. Lossless compression techniques, such as spectral decomposition (sub-banding) and intra-channel, or inter-channel, decorrelation, may be used to reduce the bit rate of audio data by exploiting the redundancies that are typically inherent in such audio signals. The efficiency of lossless compression techniques is dependent on the statistics of the audio content of the audio signals; therefore the achievable coded bit rate is variable and indeterminate. This poses a problem for communications systems in which the channel transmission bandwidth may be insufficient to convey either the short-term or long-term audio bandwidth. Also, in some systems the bandwidth utilized by the audio coding algorithm must be restricted under certain circumstances, for example low power operation or as a consequence of quality of service considerations.

Accordingly, in systems embodying the invention, the encoder 12 selectively quantizes the data during the coding process in order that the maximum bit rate supported by the channel 16, or other target bit rate, is not exceeded. Advantageously, quantization, when performed, is performed in addition to any lossless (or lossy) compression method(s) that are implemented by the encoder 12. Hence, preferred embodiments of the encoder 12 support modification of an otherwise-lossless audio coding algorithm to selectively apply quantization. Quantization of the audio samples approximates a large set of discrete values using a smaller set, thereby reducing the volume of information present in that data set. However, this process can introduce unwanted artifacts and quantization noise that degrade the audio quality experienced by the listener. Quantization is a process that irreversibly loses information, therefore it should be carefully applied such that the distortion is controlled and perceptually important audio signals are retained.

Figure 2:
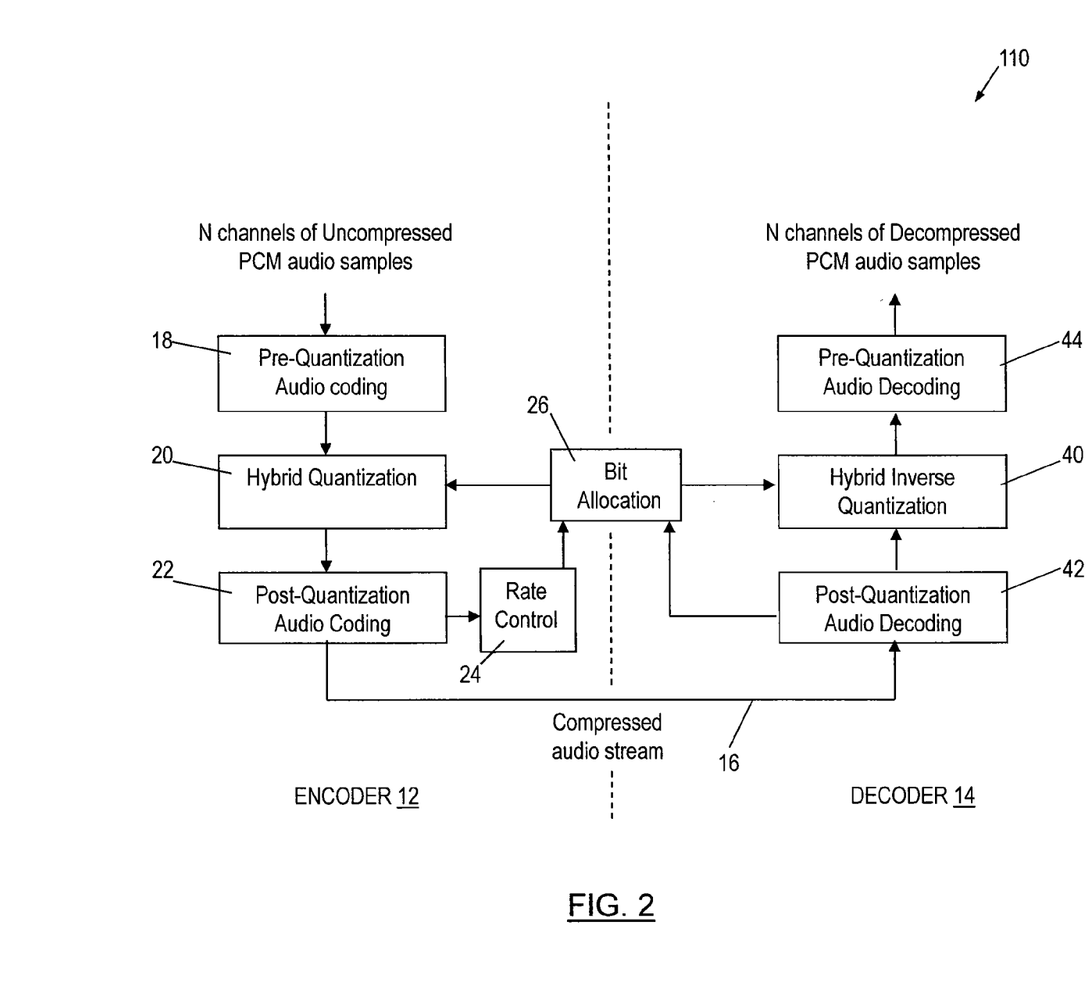
FIG. 2 is a block diagram of an encoding and decoding system (codec) for compressing digital audio data samples, the system embodying the invention and being an embodiment of the streaming audio transmission system of FIG. 1.

FIG. 2 shows an embodiment of the system 110 in more detail, wherein the encoder 12 and decoder 14 are adapted to embody the invention. The encoder 12 receives an input signal comprising N channels of uncoded, or uncompressed, audio data samples, where N is typically greater than 1, but may be equal to 1. The preferred encoder 12 comprises means for performing preliminary coding of the input signal, which in FIG. 2 is represented by preliminary, or pre-quantization, coding module 18. The preferred module 18 is configured to perform lossless compression coding on the data samples to produce a losslessly compressed data signal. Any suitable conventional lossless compression method(s) may be implemented (audio lossless compression methods in typical embodiments). Typically, the module 18 is configured to perform spectral (frequency) decomposition of the input signal into a plurality of frequency sub-bands. This may be achieved using any convenient sub-band coding transform preferably a lossless transform, for example an Integer Wavelet Transform (IWT) or an Integer MDCT (Modified Discrete Cosine Transform). In the preferred embodiment IWT is used to decompose the audio signal into a variable number of sub-bands. Spectral decomposition allows the spectral components (sub-bands) of the input signal to be manipulated by the encoder 12 separately, which is advantageous since sub-bands tend to have different relative perceptual importance to listeners. Where the input signal comprises more than one channel, spectral decomposition may be performed separately on each channel. Alternative embodiments may omit the spectral decomposition, or may include it as a selectable option.

Optionally, the module 18 is configured to, or configurable to, perform inter-channel decorrelation, and/or intra-channel decorrelation, where the input signal comprises more than one channel. In preferred embodiments, the spectral decomposition is performed beforehand and the channel signals are decorrelated on a sub-band basis.

The encoder 12 includes means for selectively quantizing the partially coded signal produced by the module 18, which in FIG. 2 is represented by hybrid quantization module 20. The hybrid quantization module 20 is configured to process each sub-band of the partially coded signal separately. Where there are more than one channels, the hybrid quantization module 20 may be configured to process each channel separately, and optionally each sub-band component of each channel separately. In particular, the hybrid quantizer may be arranged to perform compression on each channel and sub-band separately. However, when determining the type and level of quantization to be used the channel and sub-band data can be analyzed individually (simple) or collectively (more processing effort required). When it is collectively analyzed the perceptual quality of the compressed audio will tend to be higher as redundancies across channels and sub-bands can be exploited.

Typically, the encoder 12 includes means for performing final coding of the input signal, which in FIG. 2 is represented by post-quantization coding module 22. The preferred module 22 is configured to perform one or more lossless compression methods on the data signal produced by the hybrid quantization module 20. Any suitable conventional lossless compression method(s) may be implemented (typically audio lossless compression methods). In typical embodiments the module 20 is configured to perform lossless entropy encoding, e.g. Golomb-Rice entropy encoding. Alternatively, the module 22 may be configured to perform lossy compression, although this is less compatible with the aims of the invention.

More generally, module 18 and/or module 22 may be configured to perform, or be configurable to perform, one or more coding methods, including one or more compression methods (preferably lossless compression methods), on the audio data. In typical embodiments, the coding methods may include sub-band coding and/or inter-channel or intra-channel decorrelation. The preferred encoder 12 implements sub-band coding and inter-channel decorrelation before quantization, with intra-channel decorrelation and Golomb-Rice entropy coding after quantization. These techniques are applied external to the hybrid quantizer to compress the data, preferably in a lossless manner. Should the quantizer not perform any quantization the encoder 12 relies on these coding tools to provide all data compression.

Modules 18 and 22 are optional and either or both may be omitted (at least to the extent that they perform compression) from the encoder 12 (and correspondingly from the decoder 14), or modified so that the compression techniques are deactivated. In practice, some pre-quantization signal processing is usually performed not necessarily relating to compression, e.g. framing. Module 18, and/or any other suitable pre-processing module(s), may be configured to implement any necessary pre-processing of audio signals before quantization. Similarly, some post-quantization signal processing is usually performed not necessarily relating to compression, e.g. bit rate measurement, packing, overhead handling. Module 22, and/or any other suitable post-processing module(s), may be configured to implement any necessary post-processing of audio signals after quantization.

The module 22 produces a compressed output signal for sending to the decoder 14 across the communications link 16.

The encoder 12 includes means for controlling the operation of the hybrid quantization module 20 depending on the performance of the post-quantization coding module 22. In preferred embodiments, the operation of the hybrid quantization module 20 is controlled by bit allocation means (represented in FIG. 2 as module 26), which is responsive to input received from bit rate control means (represented in FIG. 2 by module 24), which in turn is responsive to an output from the post-quantization coding module 22. This is described in further detail below.

In order to achieve a determinate bit rate for the coded output signal, the audio data is advantageously structured into frames, each frame comprising a finite number of audio data samples. Conveniently, the audio data is structured into frames prior to module 18 as it is captured by the encoder 12, by any suitable conventional framing means. This enables the coding process to be modified on a frame-by-frame basis such that it can adapt to the characteristics of audio content. This adaptation is preferably performed by a rate control algorithm that provides each frame with a target number of bits to be produced by a hybrid quantization scheme.

Figure 3:
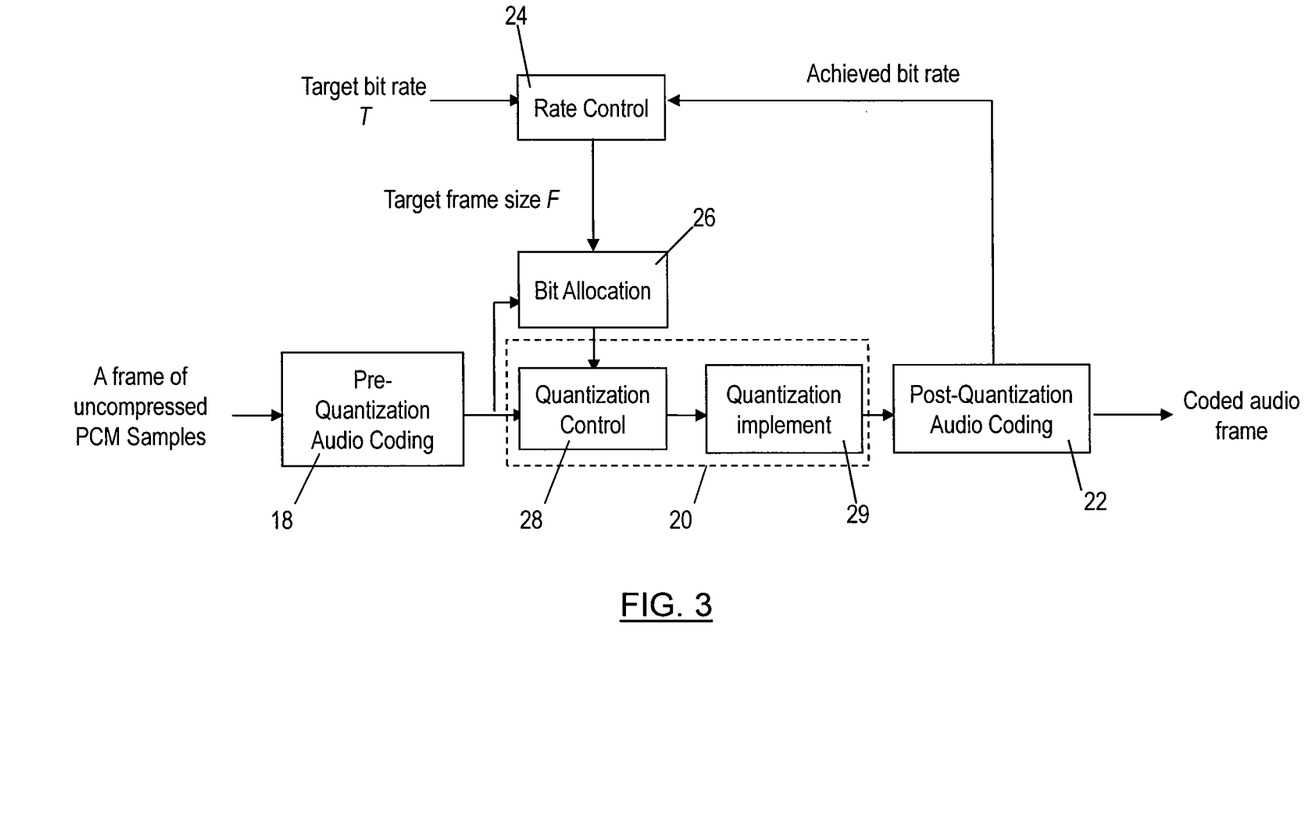
FIG. 3 is a block diagram of an audio encoder embodying the invention, the encoder supporting hybrid quantization and being suitable for use in the codec of FIG. 2.

FIG. 3 shows an alternative block diagram of the encoder 12 in which like numerals are used to indicate like parts. The rate controller 24 receives a target bit rate for each frame, which in this example is assumed to be T, matching the maximum bandwidth of the transmission channel 16, although in alternative embodiments the target bit rate need not match the maximum bandwidth of the transmission channel 16. The post-quantization coding module 22 is configured to output a stream of coded audio data arranged in frames. The post-quantization coding module 22 is further configured determine the actual bit rate achieved for each output frame. Module 22 communicates an actual bit rate to the rate controller 24. The communicated achieved bit rate may for example be the bit rate of the most recently transmitted coded audio data frame or the most recently created coded audio data frame, or other audio data frame created by the module 22. The rate controller 24 is configured to calculate a target frame size F from the target bit rate and the communicated achieved bit rate. For example, the rate controller 24 may compare the achieved bit rate to the target bit rate and to use a non-linear function to determine the target frame size F. Any function that derives a target frame size using the target bit rate and achieved bit rate (A) of each frame can be used, e.g. $F=f(T,A)$. Preferably, a non-linear function is used that is dependent on accumulated bit rate error such that the target frame size F decreases exponentially as the number of bits produced increases beyond a threshold. Controlling the frame size allows the bit rate of the system to be dynamically modified according to the requirements of the transmission channel and the audio content. The target bit rate can be set arbitrarily by the system 10 due to other application considerations such as power consumption (e.g. when plugged into a charger, a mobile device can increase the wireless bit rate) or a varying channel bandwidth (e.g. a combination WiFi/Bluetooth chip transmits audio over Bluetooth but reduces the Bluetooth channel bandwidth when experiencing heavy WiFi usage).

The pre-quantization coding module 18 is configured to communicate to the bit allocation module 26 a respective dynamic range for each component, e.g. each spectral component, of the audio data signal. In the preferred embodiment, a respective dynamic range is provided for each slice of the signal, preferably each spectral component of each slice. Typically, the dynamic range comprises a value indicating the difference between the respective maximum and minimum values, to indicate the signal power. In the present example, the dynamic range is calculated it is the log base 2 of the absolute maximum signal level of each sub-band component.

The target frame size F and the respective dynamic ranges are used by the bit allocation means 26 to allocate bits to respective components of the audio data signal, e.g. spectral components, the number of allocated bits being used to determine how the respective signal component is processed by the hybrid quantization module 20.

In the illustration of FIG. 3, the hybrid quantization module 20 comprises a quantization control component 28 and a quantization implementation component 29. The quantization implementation component 29 supports a plurality of selectable quantization options that may be applied to the data signal received from the pre-quantization coding module 18. The bit allocation module 26 operates in conjunction with a quantization control module 28 to determine how the respective audio signal components are processed by the quantization implementation module 20.

Figure 4:
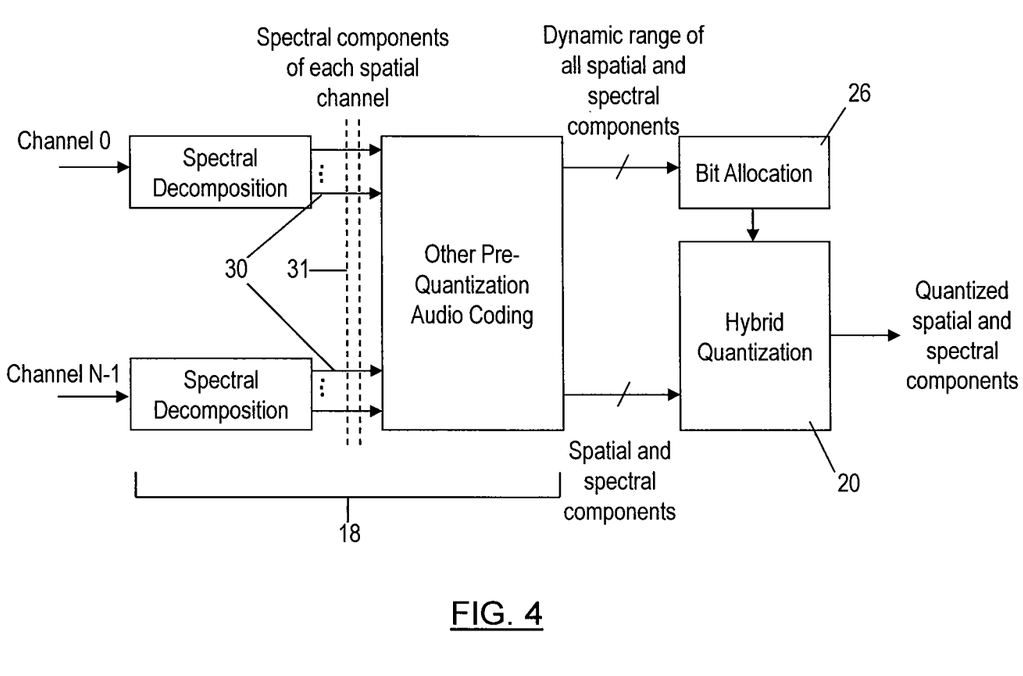
FIG. 4 is a block diagram of an embodiment of part of the encoder of FIG. 3, wherein hybrid quantization is applied to a plurality of spatial channels and spectral decompositions of those channels.

FIG. 4 shows part of the encoder 12, like numerals being used to denote like parts, illustrating how in typical embodiments the received uncoded audio data signal comprises a plurality of channels (channel 0 to channel N−1) each of which is subjected separately to spectral decomposition by the pre-quantization coding module 18 before being subjected to other pre-quantization coding as applicable. This produces a respective plurality of spectral signal components 30 for each channel. After the applicable pre-quantization coding is performed, the respective spectral components for each channel are provided to the hybrid quantization module 20. These signal components may be referred to as the spatial and spectral 10, components of the audio signal. The channels may be referred to as spatial channels since each channel represents audio data at a different position in space. The spectral components of each channel can be processed individually or jointly depending upon the coding tool.

The pre-quantization coding module 18 (or other pre-quantization module) may be configured to communicate to the bit allocation module 26 a respective dynamic range for each spatial and spectral component of the audio data signal. Alternatively, the pre-quantization coding module 18 may provide the audio signal components to the module 26, the module 26 being configured to determine the dynamic range of the components.

The hybrid quantization module 20 produces an output comprising selectively quantized spatial and spectral signal components. Typically, quantisation is performed separately on a per channel basis, although deciding how to quantize and by how much can be performed separately or jointly.

Where there is only one channel, i.e. N=1, it will be apparent that the pre-quantization module 18 and hybrid quantizer 20 may operate in substantially the same manner as described above.

In preferred embodiments, the operation of the encoder 12 to perform hybrid quantization is as follows: audio coding methods are utilized (by module 18 and/or module 22) to reduce the bit rate of the compressed audio stream preferably by means of lossless compression; the audio data signal is divided into frames each comprising a finite number of audio data samples; each audio frame is assigned a total number of bits F according to a rate control mechanism; preferably, each frame is further divided into a plurality of segments, hereinafter referred to as slices, each slice comprising part of the audio signal at a respective time interval; the total number of bits F assigned to each frame is used to determine a bit allocation for each slice of the respective frame. Preferably, each slice comprises a respective part of the spectral components of the audio signal at respective time interval.

In preferred embodiments, the audio data is structured into multiple channels with multiple spectral components in each channel. The data is divided into successive time slices, each slice relating to a respective time interval, and where each slice comprises a plurality of spectral components, each corresponding to part of a respective spectral component of the audio signal. So, where there is more than one channel, each slice comprises S spectral components across N channels (typically respective sub-groups of the S spectral components belong to a respective one of the N channels). This is illustrated in FIG. 4, where a slice is indicated as 31). Where N=1, each slice comprises a plurality of spectral components, each corresponding to part of a respective spectral component of the audio signal.

Each audio data frame comprises an integer number of slices. The spectral components of each slice may have a different perceptual importance to the human hearing system (depending on frequency). Therefore the determination of how many bits from the frame size F should be assigned to each spectral component of a slice is advantageously made according to their respective perceptual importance, among other factors such as dynamic range. Every slice within a frame is then quantized using the bits that have been allocated to the respective slice spectral components on a slice by slice basis. Conveniently, the same bit allocation for the various components of a slice is used for each slice in a frame, but may be changed for subsequent frames.

In embodiments where spectral decomposition of the audio signal is performed (e.g. in module 18), it is preferred to utilize a lossless transform (which may be implemented by a lossless filter) for the spectral decomposition in order to maintain the ability to achieve mathematically lossless compression (and therefore lossless decompression). For example an Integer Wavelet Transform or an Integer Modified Discrete Cosine Transform could be used for this purpose. Alternatively, a lossy transform could be used.

During bit allocation, the preferred encoder 12 takes into account the spatial and spectral importance of the audio content since the audio signal is decomposed into such components. This enables the preferred hybrid quantization method to consider the perceptual importance of each component of the audio signal with respect to the others when determining distribution of quantized bits.

Figure 5:
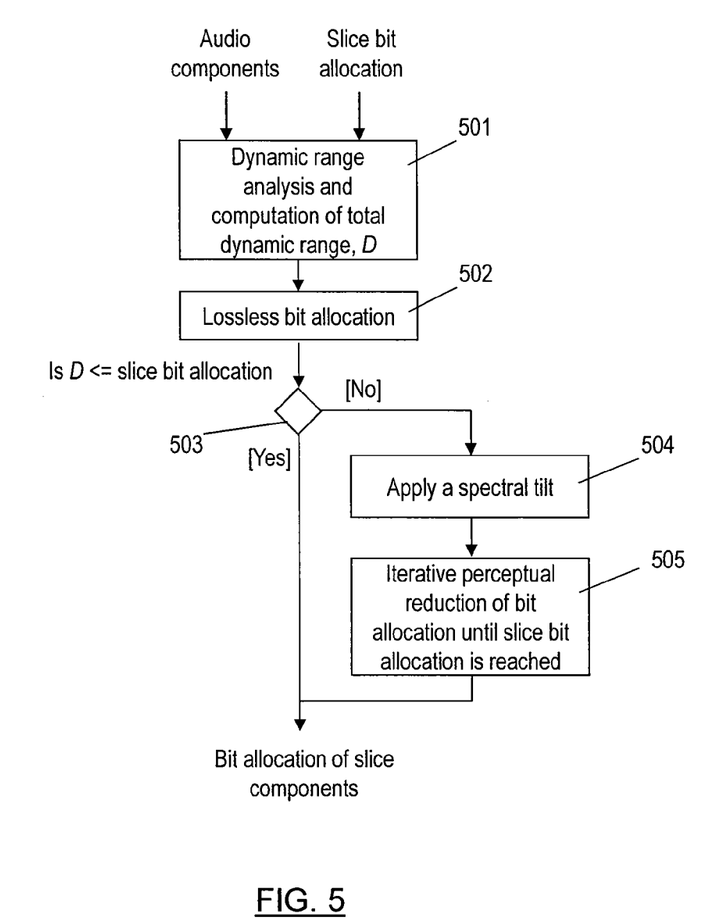
FIG. 5 is a flow diagram illustrating a preferred bit allocation method suitable for use by the encoder of FIG. 3.

Referring now to FIG. 5, there is shown a preferred method of bit allocation, which may be performed in whole or in part, as is convenient, by the bit allocation module 26. The audio signal components are analyzed to determine the appropriate level of quantization that is required to achieve the target bit rate. This is achieved by determining how many bits each signal component must be represented by.

At block 501, the audio data components are analyzed to determine the respective dynamic range of each of the spatial and spectral components across each slice of each frame. The respective dynamic range is used to determine (block 502) an initial (lossless) bit allocation D for the slice (i.e. a respective allocation of bits to each component of the slice) which, if used during hybrid quantization, will result in no lossy compression being applied to the respective signal component. This analysis may be performed in module 18 or module 26 as is convenient. Typically, the dynamic range of each component is computed as the maximum range of the respective component over all slices in each frame.

At block 503, at test is made to determine if the lossless bit allocation D is less than or equal to the respective slice bit allocation. In this context, the slice bit allocation is the total number of bits available for the respective slice which, in a simple embodiment, is calculated by dividing the target frame size F by the number of slices in the frame. If it is, then the lossless bit allocation is set as the respective slice bit allocation for the purposes of hybrid quantization.

If the respective lossless bit allocation D is not less than or equal to the respective slice bit allocation, then the lossless bit allocation D is adjusted, preferably on the basis of a tilt (weighting) applied across the respective slice components according to any spectral decomposition that has occurred (block 504). Advantageously, the tilt applies a greater perceptual importance to lower frequencies. For example, the spectral tilt may apply a weighting to the spectral components of each channel according to perceptual importance, such that lower frequencies are favoured when determining an initial bit allocation. An iterative process may then employed to obtain a bit allocation across the slice that meets the respective slice bit allocation. A single bit allocation is conveniently performed for each frame and is applied to every slice within that frame.

At block 505, an iterative process is applied to reduce the respective number of bits assigned to one or more of the components of the respective slice until the total bit allocation for the slice is reached. In the preferred embodiment, this process involves reducing the bits allocated to each temporal and spectral component in a sequential manner. The preferred sequence begins with the least perceptually important component of the slice and proceeding in sequence to progressively more perceptually important components, finishing with the most perceptually important component. The sequence may be repeated once or more until the required frame bit allocation is reached.

Once the bit allocation for each slice of each frame has been determined, the quantization scheme is selected. In the illustrated embodiment, this is performed by the hybrid quantizer 20 and in particular by the quantization control module 28. The preferred selective quantization process comprises the following options:

(1) If the respective individual bit allocation for a signal component is equivalent to the respective dynamic range of the respective audio signal component, then the respective audio signal component is not quantized. Where the dynamic range is measured in bits, then this test may conveniently be made by determining if the dynamic range is equal to (or alternatively not more than) the slice bit allocation.

(2) If the respective individual bit allocation is less than required by the respective dynamic range of the respective audio signal component, and if the respective individual bit allocation is relatively high (e.g. exceeding a predetermined threshold value, which may be determined experimentally), and, preferably also, if the respective audio signal component also has a high dynamic range in comparison to the sample depth of the uncompressed audio, a truncation function is applied to the respective audio signal component to produce a corresponding truncated signal component, whose size matches the respective component bit allocation; or (3) If the respective bit allocation of a respective audio signal component is low with respect to its dynamic range (e.g. less than required by the respective dynamic range of the respective audio signal component), a quantization scheme is applied to the respective audio signal component to produce a corresponding quantized signal component. Preferably, a non-adaptive uniform scalar quantization scheme is applied. Advantageously, the quantization scheme provides for more aggressive bit reduction of an audio signal component than truncation.

Figure 6:
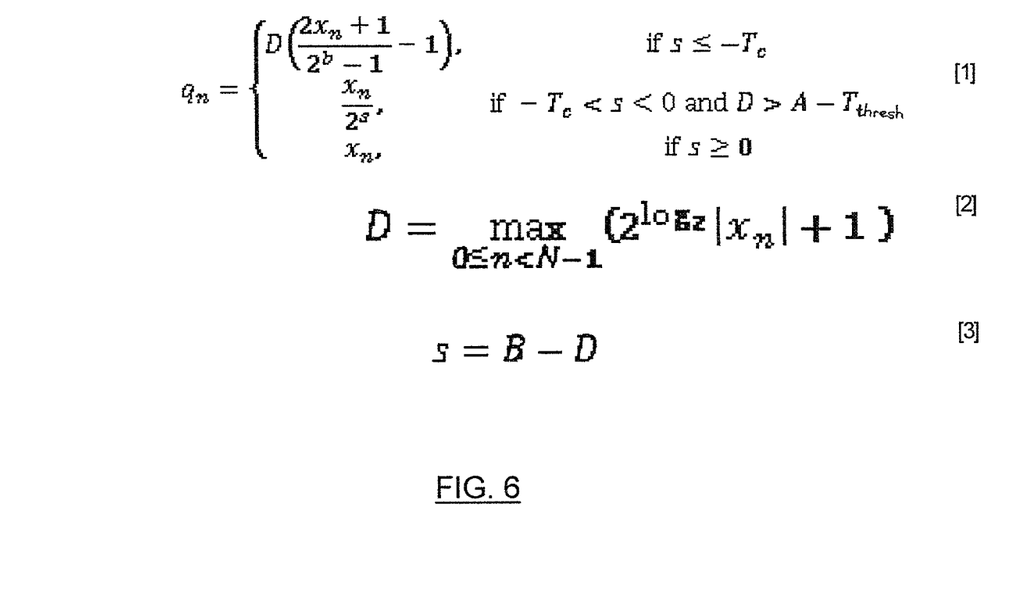
FIG. 6 shows mathematical equations representing an embodiment of a quantization scheme suitable for use in the encoder of FIG. 3.

FIG. 6 shows a set of equations describing a preferred selective quantization process, where D is the dynamic range, B is the allocated number of bits, A is the sample depth, $T_{thresh}$ is a first truncation threshold, $T_c$ is a second threshold called the truncation cut-off, x is the signal to be quantized and q is the selectively quantized signal (which in this example may comprise x (no quantization or truncation), or quantized or truncated versions of x), N is the number of audio signal components and b is a quantization parameter that determines the level of quantization applied.

Equation [2] shows how the dynamic range of a respective signal component may be calculated. Equation [3] calculates a parameter s, whose value is indicative of whether or not the dynamic range (measured in bits) of the respective audio signal component exceeds the respective bit allocation for that component. Equation [1] shows how a selected one of three functions is applied to the audio signal component depending on, in particular, the value of s, but preferably also on other conditions.

It will be understood that the invention is not limited to the three functions shown in FIG. 6, and that more generally, a plurality of quantization functions are supported for selection and implementation by the hybrid quantizer 20. Preferably, one of the functions is a non-quantizing, e.g. a null function, which passes the audio signal component through the hybrid quantizer 20 unaffected. Preferably, there is at least one other selectable function that quantizes the audio signal component (in the context of the invention, truncation is considered to be a form of quantization). More preferably, there are at least two other selectable functions that quantize the audio signal component with respective different degrees of severity (i.e. apply higher or lower levels of quantization with respect to one another). The selection of which function to apply is determined by a comparison of the dynamic range of the audio signal component with the respective bit allocation for that component.

Advantageously, if the respective bit allocation is large enough to accommodate (losslessly) the respective dynamic range, then the null function is selected. Otherwise one of the other available functions is selected. Selection between the other functions may be determined by the amount by which the respective bit allocation is less than is required to accommodate (losslessly) the respective dynamic range, e.g. one or more threshold values may be set and a function selected depending on the value of parameter s with respect to the threshold(s). By "accommodate" it is meant that the data values in the respective dynamic range can be represented using the bit allocation. Alternatively, or in addition, selection between the other functions may be determined by one or more other characteristics of the audio signal component (such as dynamic range) and/or the uncompressed audio signal (e.g. sample depth).

The audio signal components are quantized (or not quantized) as per the bit allocation and quantization schemes that have been selected. Further signal processing can then be applied to the quantized audio signals (e.g. by post-quantizing coding module 22). This results in a compressed audio frame that can be encapsulated within coded stream syntax and transmitted across link 16. The size of the transmitted audio frame is determined (e.g. by post-quantizing coding module 22) and is communicated to rate controller 24 as described above. The bits produced and the bits allocated to each frame are processed using a rate control mechanism to provide a bit allocation for the subsequent frame.

The data transmitted to the decider 14, in particular the coded stream syntax, provides the decoder 14 with the respective dynamic range of the respective spatial and spectral components, as well as an indication of the respective coding decisions, including which quantization function was selected, made at the encoder 12. This information is used by the decoder 14 to reproduce the bit allocation generated by the encoder 12. The decoder 14 comprises an inverse hybrid quantization module 40 arranged to apply an corresponding inverse hybrid quantization process. The inverse quantization process is performed by first selecting the same quantization scheme as the encoder 12. The respective inverse hybrid quantization process is then performed to reconstruct the audio signal components. Any necessary audio decoding functions (corresponding to the coding functions applied by the encoder 12) are then applied to reconstruct the original uncompressed audio signal. In FIG. 2, this is performed by post-quantization and pre-quantization audio decoding modules 42, 44.

The preferred audio coding algorithm utilizes no inter-frame dependencies in order to enable each frame to be decoded in isolation. This reduces the effects of packet loss in a real-time transmission system.

It will be understood from the foregoing that the dynamically variable target frame size F provides a feedback loop to control a bit allocation system. The bit allocation system analyzes the compressed (preferably losslessly compressed) audio signals to determine an appropriate bit allocation for each audio signal component, e.g. channel and sub-band components, based upon the frame's target size. The preferred bit allocation system reduces the loss of quality associated with quantization by allocating bits based upon the perceptual importance of the frequency, the dynamic range and the channel relationship of audio samples. If inter-channel decorrelation is applied, e.g. stereo or multichannel data is exploited, then each channel contains data of varying perceptual importance. Therefore, it is preferred to apply a spatial tilt to the data prior to the iterative slice bit allocation process, in a similar manner to the spectral tilt that weights the spectral components of each slice. For example, low frequency samples may be allocated more bits than high frequency samples as the human hearing system is more susceptible to detecting distortion at lower frequencies.

Each component of encoders, decoders or codecs embodying the invention may be implemented as hardware or by hardware running computer program(s). As a result encoders, decoders or codecs embodying the invention may be implemented in hardware, by computer program(s) running on suitable hardware, or a mixture of the two.

The invention is not limited to the embodiments described herein, which may be modified or varied without departing from the scope of the invention.

The invention claimed is:

1. An audio encoder comprising a combination of hardware and software elements arranged to receive an input signal comprising a stream of un-encoded audio data samples and to produce an output signal comprising a stream of encoded audio data samples, the hardware and software elements being configured to arrange said audio data samples into a plurality of data frames, and to further arrange each frame into at least one slice, each slice comprising a respective part of at least one spectral component of the input signal, the hardware and software elements further being arranged, in respect of a data frame of said output signal, to determine an achieved bit rate that is indicative of the actual bit rate of said data frame, and to calculate a target frame size for a subsequent data frame by comparing said achieved bit rate against a target bit rate, and wherein said hardware and software elements are is arranged to determine a respective spectral component bit allocation for the or each slice of said subsequent frame based on said target frame size, said spectral component bit allocation comprising a respective bit allocation for said at least one spectral component of the input signal, the hardware and software elements further being arranged to determine a respective dynamic range for said at least one spectral component of the input signal in respect of said subsequent frame, and to compare said respective dynamic range with said respective spectral component bit allocation, the hardware and software elements including a quantizer arranged to receive said at least one spectral component of the input signal in respect of said subsequent frame and to selectably quantize or not quantize said received spectral components depending on comparison of said respective dynamic range with said respective spectral component bit allocation.

2. An encoder as claimed in claim 1, wherein said quantizer is arranged not to quantize said spectral components if said comparison of said respective dynamic range with said respective spectral component bit allocation indicates that said respective dynamic range can be losslessly accommodated by said respective spectral component bit allocation.

3. An encoder as claimed in claim 1, wherein said quantizer is arranged to quantize said spectral components if said comparison of said respective dynamic range with said respective spectral component bit allocation indicates that said respective dynamic range cannot be losslessly accommodated by said respective spectral component bit allocation.

4. An encoder as claimed in claim 1, wherein said quantizer is configured to support a plurality of selectable quantization methods, the encoder being arranged to select one or other of said quantization methods for application to said received spectral components depending on said comparison of said respective dynamic range with said respective spectral component bit allocation.

5. An encoder as claimed in claim 4, wherein each quantization method is configured to apply a respective different level of quantization.

6. An encoder as claimed in claim 4, wherein one of said quantization methods is configured to apply no quantization.

7. An encoder as claimed in claim 4, wherein said encoder is arranged to select one or other of said quantization methods for application to said received spectral components depending on the extent by which the number of bits required to accommodate the respective dynamic range exceeds the respective spectral component bit allocation.

8. An encoder as claimed in claim 4, wherein at least one of said quantization methods comprises a non-adaptive uniform scalar quantization method.

9. An encoder as claimed in claim 4, wherein at least one of said quantization methods comprises a truncation function.

10. An encoder as claimed in claim 1, wherein in order to calculate said respective spectral component bit allocation for each spectral component, said encoder is arranged to assign a respective lossless bit allocation to each spectral component, said lossless bit allocation corresponding to the respective dynamic range of the spectral component, to compare the total of the lossless bit allocations with a total bit allocation for the respective slice and, if the total of the lossless bit allocations exceeds the total bit allocation for the respective slice, to reduce one or more of the respective lossless bit allocations until the total of the initial bit allocations does not exceed the total bit allocation for the respective slice.

11. An encoder as claimed in claim 10, wherein said encoder is arranged to reduce the bit allocation of one or more spectral components in an order corresponding to a weighting of said spectral components, wherein said weighting is preferably determined by the relative perceptual significance of said spectral components to a human listener.

12. An encoder as claimed in claim 10, wherein if the total of the lossless bit allocations does not exceed the total bit allocation for the respective slice, the encoder is configured to use said lossless bit allocations as said spectral component bit allocations.

13. An encoder as claimed in claim 11, wherein during said reduction of bits, one or more bits are removed from the respective bit allocation of one or more spectral components deemed to be of relatively low perceptual significance.

14. An encoder as claimed in claim 1, wherein the encoder includes a pre-quantization coder arranged to apply one or more data compression methods, preferably lossless data compression methods, to said un-encoded audio data samples.

15. An encoder as claimed in claim 1, wherein the encoder includes a pre-quantization coder arranged to apply a spectral decomposition transform, preferably a lossless transform, to said un-encoded audio data samples to produce a plurality of spectral audio data components.

16. An encoder as claimed in claim 15, wherein each spectral component comprises a respective spectral audio data component.

17. An encoder as claimed in claim 16, wherein said input signal comprises a plurality of audio channels, said encoder being arranged to perform said spectral decomposition in respect of each channel, each spectral component comprising a respective spectral audio data component of a respective channel.

18. An encoder as claimed in claim 1, wherein said input signal comprises a plurality of audio channels, said encoder including a pre-quantization coder arranged to perform inter-channel or intra-channel decorrelation of said channels.

19. An encoder as claimed in claim 1, wherein the encoder includes a post-quantization coder arranged to apply one or more data compression methods, preferably lossless data compression methods, to the quantized audio data samples.

20. An encoder as claimed in claim 1, wherein said input signal comprises a plurality of audio channels, said encoder including a post-quantization coder arranged to perform inter-channel or intra-channel decorrelation of said channels.

21. An audio data compression system comprising an encoder as claimed in claim 1 and a decoder arranged for communication with one another across a communications link.

22. An audio encoder comprising hardware programmed by computer software to encode an audio input signal received by said hardware, said audio input signal comprising a stream of un-encoded audio data samples, and to produce an output signal comprising a stream of encoded audio data samples, the computer software causing the hardware to perform a method comprising:
   arranging said audio data samples into a plurality of data frames, and to further arrange each frame into at least one slice, each slice comprising a respective part of at least one spectral component of the input signal,
   determining, in respect of a data frame of said output signal, an achieved bit rate that is indicative of the actual bit rate of said data frame, and to calculate a target frame size for a subsequent data frame by comparing said achieved bit rate against a target bit rate,
   determining a respective spectral component bit allocation for the or each slice of said subsequent frame based on said target frame size, said spectral component bit allocation comprising a respective bit allocation for said at least one spectral component of the input signal,
   determining a respective dynamic range for said at least one spectral component of the input signal in respect of said subsequent frame, and to compare said respective dynamic range with said respective spectral component bit allocation,
   selecting to quantize or not quantize at least one spectral component of the input signal in respect of said subsequent frame depending on comparison of said respective dynamic range with said respective spectral component bit allocation.

23. An audio encoder comprising hardware elements arranged to receive an input signal comprising a stream of un-encoded audio data samples and to produce an output signal comprising a stream of encoded audio data samples,
   the hardware elements being configured to arrange said audio data samples into a plurality of data frames, and to further arrange each frame into at least one slice, each slice comprising a respective part of at least one spectral component of the input signal,
   the hardware elements further being arranged, in respect of a data frame of said output signal, to determine an achieved bit rate that is indicative of the actual bit rate of said data frame, and to calculate a target frame size for a subsequent data frame by comparing said achieved bit rate against a target bit rate,
   and wherein said hardware elements are arranged to determine a respective spectral component bit allocation for the or each slice of said subsequent frame based on said target frame size, said spectral component bit allocation comprising a respective bit allocation for said at least one spectral component of the input signal,
   the hardware elements further being arranged to determine a respective dynamic range for said at least one spectral component of the input signal in respect of said subsequent frame, and to compare said respective dynamic range with said respective spectral component bit allocation,
   the hardware elements including a quantizer arranged to receive said at least one spectral component of the input signal in respect of said subsequent frame and to selectably quantize or not quantize said received spectral components depending on comparison of said respective dynamic range with said respective spectral component bit allocation.

\* \* \* \* \*